(12) United States Patent
Otani et al.

(10) Patent No.: US 11,206,087 B2
(45) Date of Patent: Dec. 21, 2021

(54) OPTICAL MODULE AND OPTICAL TRANSMITTER

(71) Applicant: Mitsubishi Electric Corporation, Tokyo (JP)

(72) Inventors: Tatsuki Otani, Tokyo (JP); Akio Shirasaki, Tokyo (JP); Norio Okada, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 17/053,696

(22) PCT Filed: May 29, 2018

(86) PCT No.: PCT/JP2018/020445
§ 371 (c)(1),
(2) Date: Nov. 6, 2020

(87) PCT Pub. No.: WO2019/229825
PCT Pub. Date: Dec. 5, 2019

(65) Prior Publication Data
US 2021/0218473 A1    Jul. 15, 2021

(51) Int. Cl.
*H04B 10/50* (2013.01)
*H01S 5/02* (2006.01)
*H04B 10/80* (2013.01)

(52) U.S. Cl.
CPC ......... *H04B 10/504* (2013.01); *H01S 5/0215* (2013.01); *H04B 10/801* (2013.01)

(58) Field of Classification Search
None
See application file for complete search history.

(56) References Cited

U.S. PATENT DOCUMENTS 6,323,986 B1 * 11/2001 Lee ............... H04B 10/505
                                                  359/248
6,437,899 B1 *  8/2002 Noda .............. G02F 1/0121
                                                  257/728

(Continued)

FOREIGN PATENT DOCUMENTS

JP    2011-197360 A    10/2011
JP    2011197360 A  * 10/2011
WO   2010/140473 A1  12/2010

OTHER PUBLICATIONS

International Search Report issued in PCT/JP2018/020445; dated Aug. 7, 2018.

*Primary Examiner* — David W Lambert
(74) *Attorney, Agent, or Firm* — Studebaker & Brackett PC

(57) ABSTRACT

Provided is an optical module comprising a plate-like metal stem and a semiconductor optical modulation element mounted to a dielectric substrate provided on one side of the metal stem, wherein the metal stem has a metal stem penetration section in which a metal lead pin is inserted coaxially in a penetration hole which is formed in the metal stem and a dielectric member is provided to fill the penetration hole around the outer circumference of the lead pin, and a signal for modulation is supplied to the semiconductor optical modulation element connected in parallel with a terminal matching circuit, from the other side of the metal stem via the metal stem penetration section, wherein the terminal matching circuit is configured by a series connecting body which is comprised of a first resistor and a parallel body which is comprised of a second resistor and a capacitor.

9 Claims, 14 Drawing Sheets

(56) References Cited

U.S. PATENT DOCUMENTS

| | | | | |
|---|---|---|---|---|
| 9,614,351 B1* | 4/2017 | Asmanis | ............ | H01S 5/06258 |
| 2006/0007516 A1* | 1/2006 | Kagaya | ................ | G02F 1/0121 |
| | | | | 359/245 |
| 2006/0008194 A1* | 1/2006 | Kagaya | ................ | G02F 1/0121 |
| | | | | 385/1 |
| 2006/0176918 A1* | 8/2006 | Aruga | ................ | H01S 5/02345 |
| | | | | 372/38.1 |
| 2012/0045161 A1 | 2/2012 | Okada | | |
| 2012/0269479 A1* | 10/2012 | Okada | ..................... | G02F 1/015 |
| | | | | 385/14 |
| 2012/0281723 A1* | 11/2012 | Oh | ..................... | H01S 5/02446 |
| | | | | 372/20 |
| 2015/0116809 A1* | 4/2015 | Uto | ..................... | H01S 5/02212 |
| | | | | 359/245 |

* cited by examiner

OPTICAL MODULE AND OPTICAL TRANSMITTER

TECHNICAL FIELD

This application relates to an optical module on which a semiconductor optical modulation element is mounted.

BACKGROUND ART

Regarding an access system which is an optical communication system between a relay station and an user, conventionally, in many cases, a Directly Modulated Laser (DML), which is suitable for low speed modulation, is used, however, in a case where high speed communication which is 10 Gb/s or higher is performed, an Electro-absorption Modulator integrated Laser Diode (EAM-LD), which is an optical semiconductor integrated element, in which an Electro-absorption Modulator (EAM) which is suitable for high speed modulation and a Distributed Feedback Laser Diode (DFB-LD) are integrated is suitable.

By applying a signal, which repeats ON/OFF with frequency of modulation of light, to an EAM, light (laser light) which passes through an EAM can be modulated. In high speed communication, a high frequency signal which is offset by DC voltage is applied. A high frequency signal is high frequency which is 10 GHz or higher, therefore as a feeder, a line for which a high frequency characteristic is considered such as a coaxial line is used.

As an example of a configuration for transmitting high frequency for modulation, there is a coaxial type semiconductor optical modulation device which comprises a plate-like metal stem and a semiconductor optical modulation element which is mounted on a dielectric substrate which is provided on one side of the metal stem, wherein a metal lead pin is coaxially inserted in a penetration hole which is formed in the metal stem and the metal stem has a metal stem penetration section having a dielectric member for filling a penetration hole which is provided in a perimeter of a lead pin, and from other surface side of a metal stem, via the metal stem penetration section, high frequency signal for modulation is supplied to a semiconductor optical modulation element to which terminal matching circuits are connected in parallel (for example, Patent Document 1, Patent Document 2).

PRIOR ART DOCUMENT

Patent Document

Patent Document 1: International publication WO2010/140473A
Patent Document 2: JP 2011-197360A

SUMMARY OF THE INVENTION

Problems to be Solved by the Invention

In a case where a semiconductor optical modulation element is an EAM-LD, due to influence of parasitic capacitances, parasitic resistances, inductances of bonding wires, etc., as frequency is higher, it is more difficult to obtain impedance matching. Further, regarding a lead pin penetration section of a metal stem, due to restriction of a glass diameter and a lead pin diameter, line impedance is 20Ω to 30Ω, as matching resistance, it cannot be matched with general 50Ω. In a case of a coaxial type, the two points are reflection points, an electrical signal is reflected at an EAM, further, the electrical signal is reflected at a part where the electrical signal penetrates a metal stem, when the electrical signal returns again to an EAM, if a phase of the electrical signal is rotated by 180 degrees, the gain is cancelled so as to cause band deterioration.

This application discloses technology for solving the above mentioned problems, and aims to supply a high frequency signal for modulation up to higher frequency while suppressing band degradation due to multiple reflection in an optical module in which a semiconductor optical modulation element is provided.

Means for Solving Problems

An optical module which is disclosed by this application comprises a metal stem having a plate-like shape and a semiconductor optical modulation element mounted on a dielectric substrate provided on one side of the metal stem, wherein the metal stem has a metal stem penetration section in which a lead pin made of metal is inserted coaxially in a penetration hole which is formed in the metal stem and a dielectric member is provided to fill the penetration hole around the outer circumference of the lead pin, and from other surface side of the metal stem, via the metal stem penetration section, a signal for modulation is supplied to the semiconductor optical modulation element connected in parallel with a terminal matching circuit, wherein the terminal matching circuit is configured by a series connecting body which is comprised of a first resistor and a parallel body which is comprised of a second resistor and a capacitor.

Advantage Effect of the Invention

According to an optical module which is disclosed by this application, there is an effect such that an optical module, which can supply a high frequency signal for modulation up to higher frequency while suppressing degradation of band due to multiple reflection, can be provided.

EMBODIMENTS FOR CARRYING OUT THE INVENTION

Embodiment 1

Figure 1:
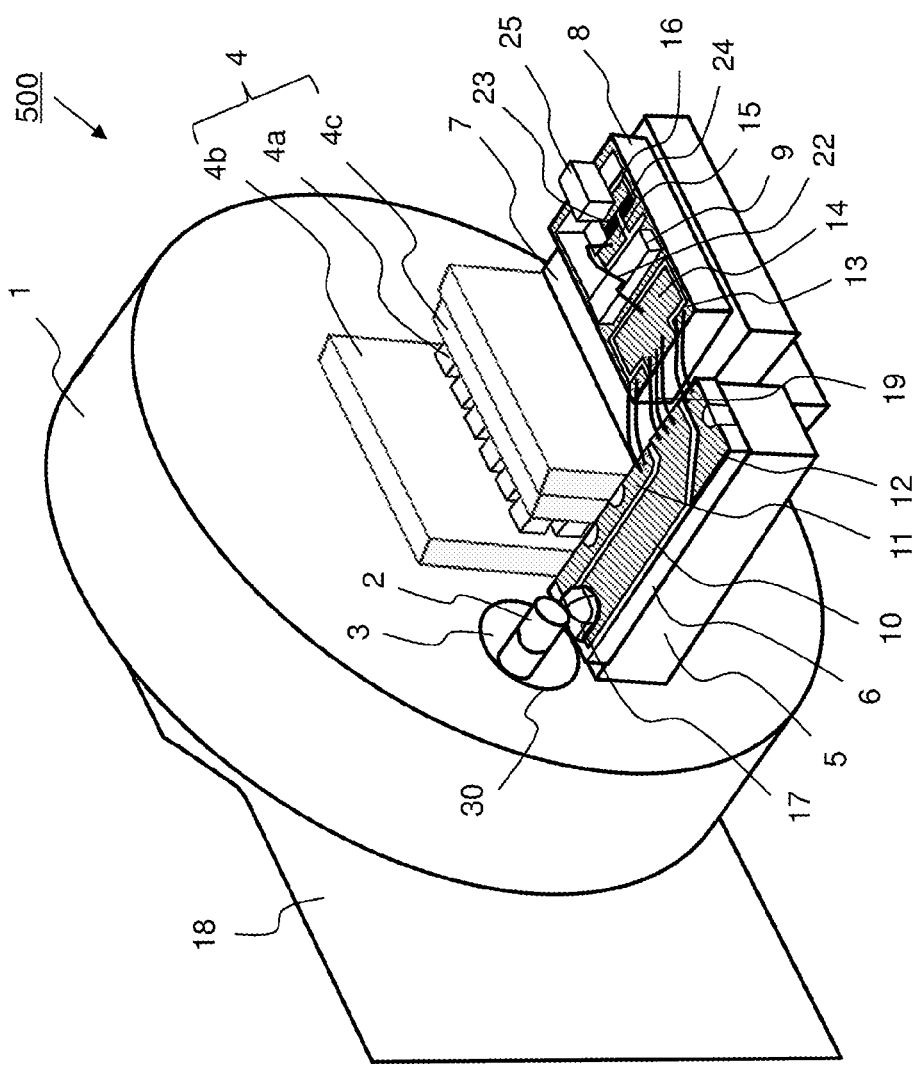
FIG. 1 is a perspective view showing a configuration of an optical module according to Embodiment 1.
Figure 2:
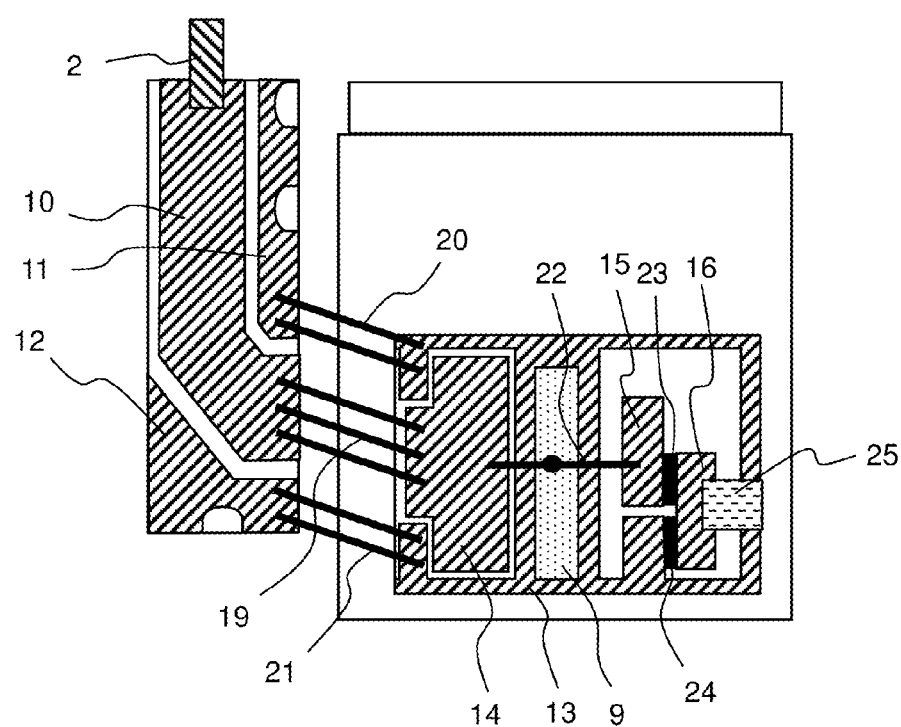
FIG. 2 is a plan view showing an essential part of an optical module, which is enlarged, according to Embodiment 1.

FIG. 1 is a perspective view showing a configuration of an optical module according to Embodiment 1. FIG. 2 is a plan view showing an essential part of an optical module, which is enlarged, shown in FIG. 1. In FIG. 1 and FIG. 2, a metal stem penetration section 30 of a metal stem 1 comprises a lead pin 2 which is coaxially inserted into a penetration hole which is formed in the metal stem 1 and a glass material 3 which is a dielectric member which is provided along the perimeter of the lead pin 2 so as to fill the penetration hole, and the lead pin 2 is fixed to the metal stem 1 via the glass material 3. According to the above mentioned configuration, the metal stem penetration section 30 is formed to be coaxial line shape with an inner circumference of a penetration hole of the metal stem 1 and the lead pin 2, and the metal stem penetration section 30 has air-tight sealing configuration. As a material of the metal stem 1 and the lead pin 2, for example, metal such as copper, iron, aluminum or stainless can be used and metal plating or nickel plating may be performed on a surface.

Further, on the metal stem 1, a temperature control module 4 and a supporting block 5 are mounted. Here, the temperature control module 4 comprises a Peltier element 4a, and a heat dissipation surface 4b and a cooling surface 4c which sandwich the Peltier element 4a. On one surface of the supporting block 5, a dielectric substrate 6 is mounted, and on the cooling surface 4c of the temperature control module 4, a supporting block 7 is mounted. On one surface of the supporting block 7, a dielectric substrate 8 is mounted, and on the dielectric substrate 8, a semiconductor optical modulation element 9 is mounted. As the semiconductor optical modulation element 9, a modulator integrated laser (EAM-LD) in which, for example, an Electro-absorption Modulator in which InGaAsP based or AlInGaAs based quantum well absorption layer is used and distributed feedback laser diode are integrated in monolithic can be used. As an optical modulator, a semiconductor MZ (Mach-Zehnder), etc. can be used. Further, in FIG. 1, in a front side of the metal stem 1, that is, a part, to which a various members are mounted, is sealed with, for example, nitrogen, however, in FIG. 1, a configuration of sealing other than the metal stem penetration section 30 is omitted. At an opposite side of the metal stem 1, a flexible printed circuit board 18, etc. to which a driver which outputs a high frequency signal of 10 GHz or higher for modulating the semiconductor optical modulation element 9 is mounted, is arranged.

On the dielectric substrate 6, a signal conductor 10 is formed. By forming the signal conductor 10 on whole surface of the dielectric substrate 6 while keeping a predetermined distance between the signal conductor 10 and a ground conductor 11, between the signal conductor 10 and a ground conductor 12, a coplanar line can be configured. Further, the ground conductor 11 and the ground conductor 12 may be electrically connected to the supporting block 5 via a through hole which is formed in the dielectric substrate 6, a castellation or a metal which is on a side surface.

Further, on the dielectric substrate 8, a signal conductor 14, a signal conductor 15, a signal conductor 16 and a ground conductor 13 are formed. Further, the ground conductor 13 is formed on the dielectric substrate 8 having a predetermined spacing between the signal conductor 14. Normally, on a back surface of the dielectric substrate 8, a conductor, which has a ground potential which is same as that of the ground conductor 13, is formed. Further, the ground conductor 13 may be formed on a side surface of the dielectric substrate 8.

Further, as a material of the supporting block 5 and the supporting block 7, for example, a metal such as copper, iron, aluminum or stainless can be used. Alternatively, as the supporting block 5 and the supporting block 7, a structure comprising an insulator such as a ceramic or a resin which is covered with a metal is may be used. As a material of the dielectric substrate 6 and the dielectric substrate 8, for example, a ceramic such as an AlN or an alumina can be used. Further, a resin such as an epoxy can be used. Further, it is preferable for the supporting block 5 to be arranged in the vicinity of the lead pin 2. Further, it is preferable for the supporting block 7 to be arranged in the vicinity of the dielectric substrate 6.

One end of the lead pin 2 and one end of the signal conductor 10 are connected each other via an adhesive 17. Another end of the lead pin 2 is connected to a flexible printed circuit board 18 (may be referred as a PCB 18) on which a driver, etc., which outputs a high frequency signal for modulating the semiconductor optical modulation element 9, is mounted. Further, another end of the signal conductor 10 and one end of the signal conductor 14 are connected each other via a bonding wire 19. Further, the ground conductor 11, the ground conductor 12 and the ground conductor 13 are connected each other via a bonding wire 20 and a bonding wire 21. There is no limitation regarding the number of any bonding wire. Further, a configuration in which both of the bonding wire 20 and the bonding wire 21 are not provided, only one of these is provided is acceptable. Further, the semiconductor optical modulation element 9 is connected to the signal conductor 14 and the signal conductor 15 via a bonding wire 22.

A first resistor 23 is connected between the signal conductor 15 and the signal conductor 16, and a second resistor 24 is connected between the signal conductor 16 and a ground conductor 13. A capacitor 25 is connected between the signal conductor 16 and the ground conductor 13. As the capacitor 25, for example, a MIM capacitor can be used. Regarding the capacitor 25, any configuration in which a dielectric member is sandwiched by conductors is acceptable, and as will be described in Embodiment 2 and Embodiment 3, various configurations are acceptable.

Figure 3:
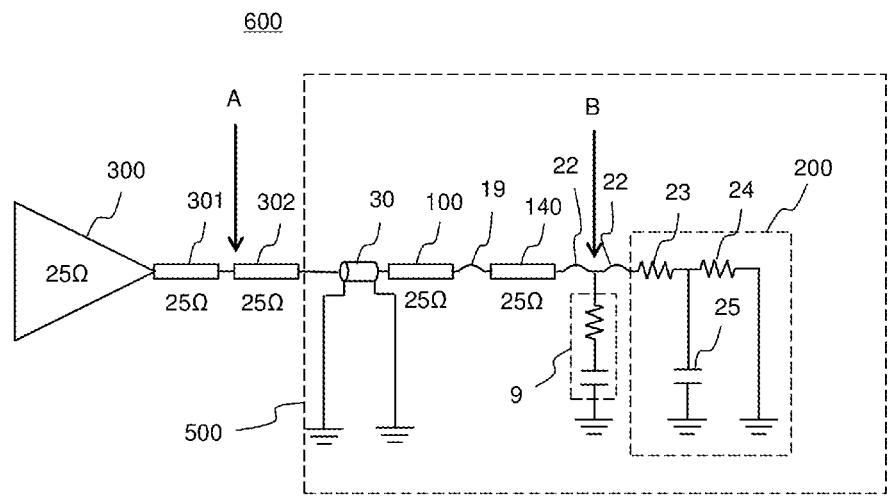
FIG. 3 is a circuit diagram showing a configuration of an optical module according to Embodiment 1.

FIG. 3 is a circuit diagram of an optical module according to Embodiment 1 shown in FIG. 1 and FIG. 2. As shown in FIG. 3, in an optical module according to Embodiment 1, a terminal matching circuit 200 is connected to the semiconductor optical modulation element 9 in parallel. The terminal matching circuit 200 has a configuration in which a first resistor 23 is connected to a parallel body having the second resistor 24 and the capacitor 25 in series. A driver 300 which is mounted on the PCB 18 and the semiconductor optical modulation element 9 are connected by a line comprising a signal line 301 which is formed on the PCB 18, a signal line 302 which is connected the signal line 301 of the PCB 18 and a metal stem penetration section 30, the metal stem penetration section 30, a signal line 100, which is a coplanar line comprising a signal conductor 10, the ground conductor 12 and the ground conductor 11, a bonding wire 19, a signal line 140, which is a coplanar line comprising the signal conductor 14 and the ground conductor 13, and a bonding wire 22, and a high frequency signal is supplied to the semiconductor optical modulation element 9. Further, in this application, the metal stem 1 and a front side of the metal stem 1 shown in FIG. 1, that is, a part on which various members are mounted, that is, a part which is designated with reference number 500 in FIG. 3 will be referred to an optical module 500 and a part including a driver, that is, whole part shown in FIG. 3 will be referred to an optical transmitter 600.

Next, an operation will be described. In the semiconductor optical modulation element 9, a parasitic capacitance component, a parasitic resistance component and a parasitic inductance of a bonding wire to which an electrode is connected exist, as frequency of an input signal becomes higher, obtaining impedance matching becomes more difficult. On the other hand, regarding the metal stem penetration section 30 of the metal stem 1, from a view point of air-tightness and reliability, a diameter of the lead pin 2 is 0.3 to 0.4 mm, a diameter of the glass material 3 is 0.7 to 0.8 mm, a dielectric constant of glass εr is 5.5 to 7.0 and impedance is 20 to 30Ω.

Figure 5:
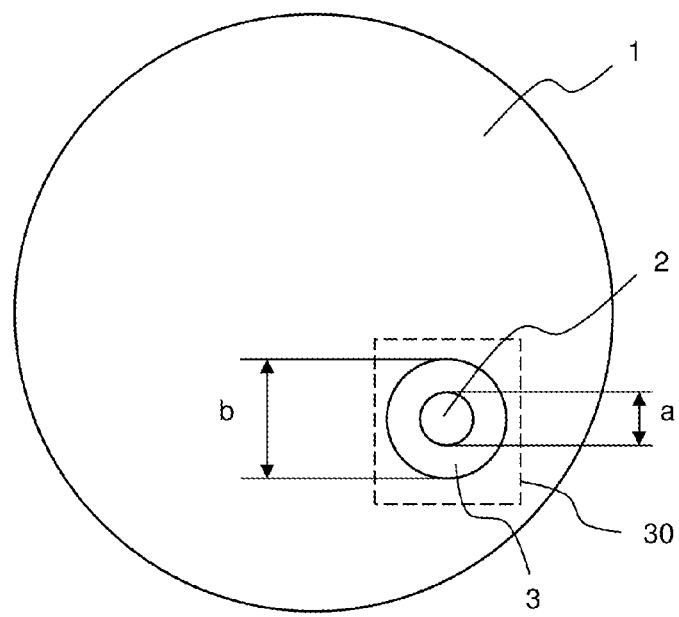
FIG. 5 is a side view showing a configuration of a metal stem penetration section of an optical module according to Embodiment 1.

FIG. 5 is a figure showing the metal stem penetration section 30 which is enlarged. Characteristic impedance Z of the metal stem penetration section 30 is expressed by following formula.

$$z = \mathrm{SQRT}(\mu/\varepsilon) \times (\tfrac{1}{2} \times n) \times \mathrm{Log}(b/a)$$

Here, μ indicates a permeability of the lead pin 2, ε indicates a dielectric constant of the dielectric member 3 which is a metal stem penetration section sealing material, a indicates a diameter of the lead pin 2 and b indicates a diameter of the metal stem penetration section (an inner diameter of penetration hole=an outer diameter of the dielectric member 3)

Figure 6:
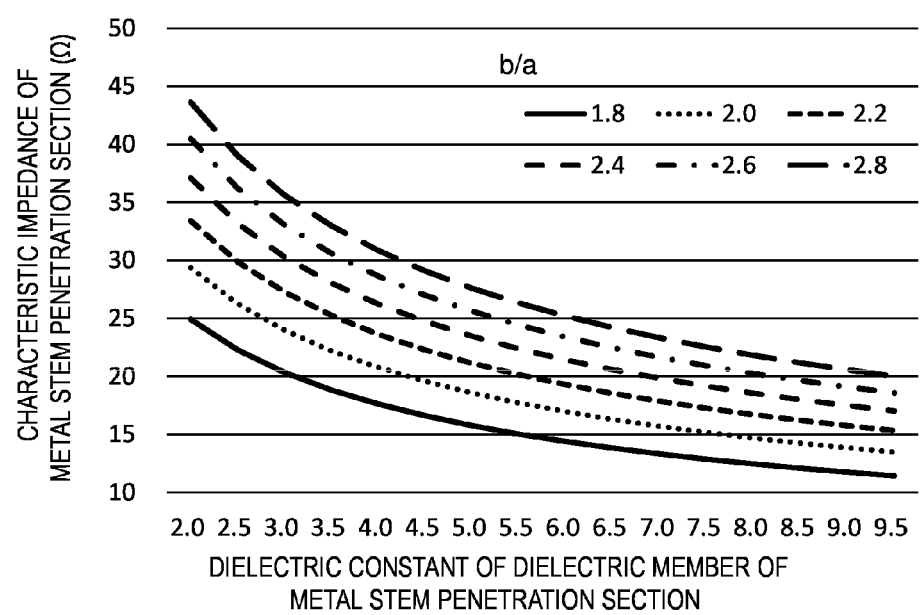
FIG. 6 is graph for describing characteristics examples of a metal stem penetration section of an optical module according to Embodiment 1.

FIG. 6 shows a result of simulation of characteristic impedance of the metal stem penetration section 30 in a case where a permeability of a lead pin is set to be 1, a dielectric constant of the dielectric member 3, and b/a, which is ratio of a diameter of a lead pin, a, and a diameter of a metal stem penetration section, b, are parameters. Regarding the dielectric member 3 of a metal stem penetration section, as long as an air-tightness inside a package is maintained, a dielectric material other than glass can be used. Generally, in many cases, a circuit is designed for impedance to be 50Ω, however, as shown in FIG. 6, when a material of a dielectric member 3 is selected considering an air-tight sealing, it is difficult for characteristic impedance of the metal stem penetration section 30 to be 50Ω, and characteristic impedance becomes approximately 25Ω.

Figure 4:
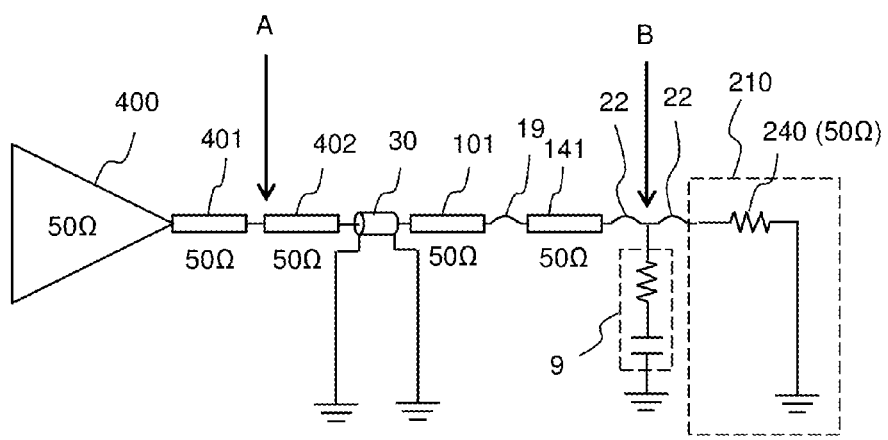
FIG. 4 is a circuit diagram showing a configuration of an optical module in a comparative example.

An operation of an optical module according to Embodiment 1 shown in a circuit diagram of FIG. 3 will be described by comparing with an operation of an optical module in a comparative example shown in a circuit diagram of FIG. 4. A circuit diagram shown in FIG. 4 is such that a terminal matching circuit 200 having a configuration shown in FIG. 1 and FIG. 2 in which the first resistor 23 and a parallel body comprising the second resistor 24 and the capacitor 25 are connected in series is made to be a terminal matching circuit 210 comprising only a resistor 240 having a resistance value 50Ω, for example. In a case where a terminal matching circuit is designed using general 50Ω system, a terminal resistor which is provided as a terminal matching circuit of the semiconductor optical modulation element 9, as shown in a resistor 240 in FIG. 4, a terminal resistor is adjusted to be approximately 50Ω so as to secure a voltage amplitude effectively. Further, impedance of a driver 400, a signal line 401, a signal line 402, a signal line 101 and a signal line 141 which correspond to the driver 300, the signal line 301, the signal line 302, the signal line 100 and the signal line 140, individually shown in FIG. 3 is adjusted to be 50Ω. However, according to the above mentioned, as frequency of a signal becomes higher, matching of impedance with the metal stem penetration section 30 cannot be obtained. Therefore, a part of a high frequency component of an electrical signal is reflected on the semiconductor optical modulation element 9 and is returned to a side of the metal stem penetration section 30 and again, a part of a high frequency component of an electrical signal is reflected and is returned.

When a traveling wave is indicated with Y0 and an amplitude is normalized, a traveling wave will be expressed by a following formula.

$$Y0 = \sin(\omega t)$$

When a reflectance in the semiconductor optical modulation element 9 is indicated with ρ1, a reflectance in the metal stem penetration section 30 is indicated with ρ2, a reflected wave Y1 is expressed by formula, $$Y1 = \rho1 \times \rho2 \times \sin(\omega t - \Phi), \text{ and}$$

a combined wave Y2 is expressed by formula, $$\begin{aligned}
Y2 &= Y0 + Y1 \\
&= \sin(\omega t) + \rho1 \times \rho2 \times \sin(\omega t - \Phi) \\
&= A \times \sin(\omega t + \Theta)
\end{aligned}$$

Here, $$A = [[1 + \rho1 \times \rho2 \times \cos(\Phi)]^2 + [\rho1 \times \rho2 \times \sin(\Phi)]^2]^{1/2}$$

$$\mathrm{Tan}\Theta = -[\rho1 \times \rho2 \times \sin(\Phi)]/[1 + \rho1 \times \rho2 \times \cos(\Phi)]$$

Further, a phase Φ of a reflected wave can be expressed by a formula, $$\Phi = 2L \times (f/c') \times 2\pi,$$

wherein a length between the semiconductor optical modulation element 9 and the metal stem penetration section 30 is indicated with L, frequency is indicated with f and a signal speed in a transmission line is indicated with c'.

According to the above mentioned formula, it can be found out such that an amplitude of a combined wave A greatly depends on a reflectance and an effective electrical length between the semiconductor optical modulation element 9 and the metal stem penetration section 30, and has frequency dependence. From a view point such that cutoff frequency is made to be wide band, simply, it is preferable for impedance of a terminal matching circuit and impedance of a line to be matched to characteristic impedance of the metal stem penetration section 30, however, a DC gain is decreased, therefore, an amplitude of an input signal will be deteriorated.

An optical module according to Embodiment 1 aims to suppress decrease of a reflectance ρ1 when a signal having high frequency is inputted to the semiconductor optical modulation element 9 and deterioration of DC gain. When it is configured for a terminal matching circuit 210 which is configured by 50Ω resistance in a comparative example shown in FIG. 4 to be a configuration in which a terminal matching circuit 200 shown in FIG. 3, that is, a first resistor 23 is connected in series to a parallel body comprising a second resistor 24 and a capacitor 25, as frequency of an input signal becomes higher, combined impedance of the terminal matching circuit 200 becomes equal to a value of the first resistor 23. Combined impedance of the terminal matching circuit 200 will be expressed by following formula.

$$Z=R1+1/((1/R2)+(j\omega C))$$

Figure 7:
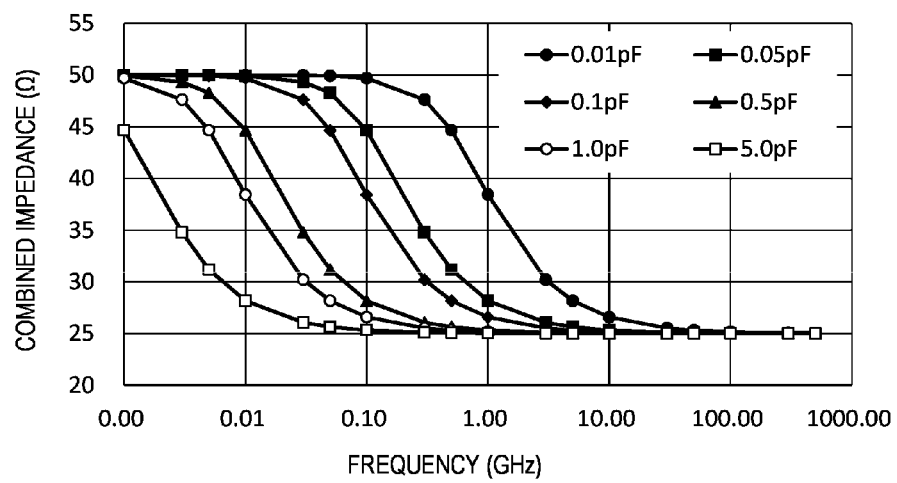
FIG. 7 is graph for describing a function of a terminal matching circuit of an optical module according to Embodiment 1.

Here, R1 indicates a resistance value of the first resistor 23, R2 indicates a resistance value of the second resistor 24 and C indicates capacitance of the capacitor 25. FIG. 7 shows combined impedance of the terminal matching circuit 200 when a resistance value of the first resistor 23 and that of the second resistor 24 are set to be 25Ω, individually, and a value of the capacitor 25 is set to be 0.01 pF to 5.00 pF.

Here, it is preferable for line impedance of the signal line 100 and that of the signal line 140, line impedance of the signal line 301 and that of the signal line 302 which are from the flexible printed circuit board 18 to the metal stem penetration section 30, and a resistance vale of the first resistor 23 to be an equal value of characteristic impedance of the metal stem penetration section 30 in order to suppress multiple reflection which is generated between the semiconductor optical modulation element 9 and the metal stem penetration section 30. Here, the equal value means such that it is good to set to be substantially equal value in a range in which multiple reflection is suppressed, even though a value is not correctly equal to characteristic impedance of the metal stem penetration section 30. For example, it is preferable to set it in a range which is 0.8 to 1.2 times of characteristic impedance of the metal stem penetration section 30. Further, from a view of DC gain, it is preferable for a resistance value of the second resistor 24 to be substantially equal value of characteristic impedance of the metal stem penetration section 30.

Figure 8A:
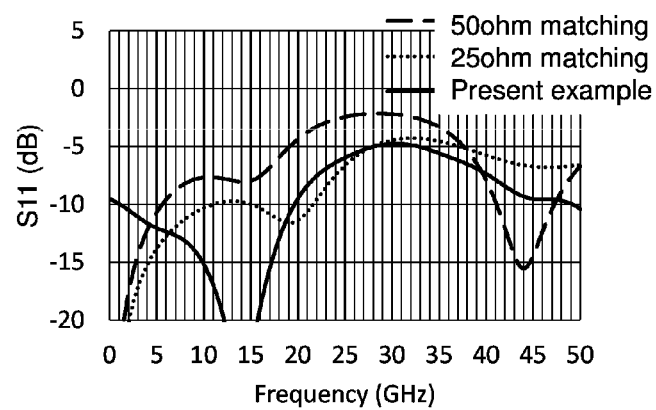
FIG. 8A and FIG. 8B are frequency characteristics diagrams for describing an effect of an optical module according to Embodiment 1 by comparing with that in a comparative example.
Figure 8B:
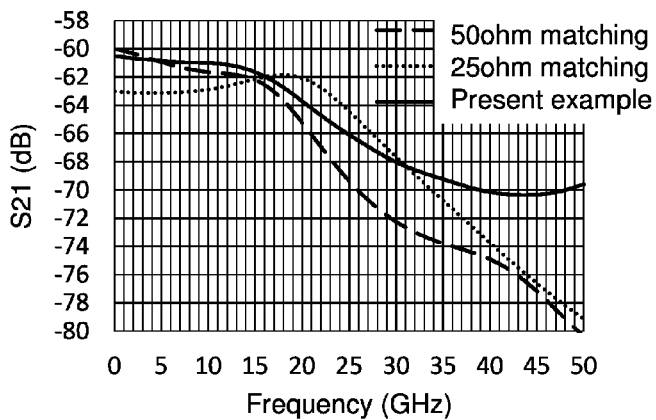

FIG. 8A and FIG. 8B show a result of simulation of a frequency characteristic of an optical module by a terminal matching circuit shown in FIG. 3 and FIG. 4 as a comparative example. FIG. 8A and FIG. 8B show frequency characteristic of S11 (reflection component) and that of S21 (transmission component) among S parameters wherein a position which is indicated with A in FIG. 3 and FIG. 4 is set to be port 1, a position which is indicated with B is set to be port 2. Among the above mentioned results of simulation, an example which is indicated with solid line shows a high frequency response characteristic in an example, wherein a resistance value of the first resistor 23 and that of the second resistor 24 shown in FIG. 3 are set to be 25Ω, individually, capacitance of a capacitor 25 is set to be 0.1 pF. Further, a broken line which shows as 50 ohm matching in a comparative example is characteristic in a case where a value of a terminal resistor 240 of the terminal matching circuit 210 shown in FIG. 4 is set to be 50Ω, a broken line which shows as 25 ohm matching is characteristic in a case where a value of the terminal resistor 240 shown in FIG. 4 is set to be 25Ω, and impedance of each signal line is set to be 25Ω. According to the above mentioned figures, in the present example, it can be found out such that impedance of the terminal matching circuit 200 at DC side is 50Ω, and that at a high frequency side is 25Ω, therefore, while deterioration of DC gain is suppressed, at high frequency, an influence due to multi-reflection can be decreased, and a frequency response characteristic can be improved.

As it was described in the above, the optical module according to Embodiment 1 has a configuration such that via the metal stem penetration section 30, a signal for modulation is supplied to the semiconductor optical modulation element 9, and the terminal matching circuit 200, which is connected to the semiconductor optical modulation element 9 in parallel, is a series connecting body comprising the first resistor 23 and a parallel body comprising the second resistor 24 and the capacitor 25. Therefore, there is an effect such that while deterioration of DC gain is suppressed, in high frequency, an influence due to multiple reflection is decreased and a frequency response characteristic can be improved. Further, when a resistance value of the first resistor 23 and that of the second resistor 24 are made to be equally same value of characteristic impedance of the metal stem penetration section 30, the above mentioned result is remarkable.

Embodiment 2

Figure 9:
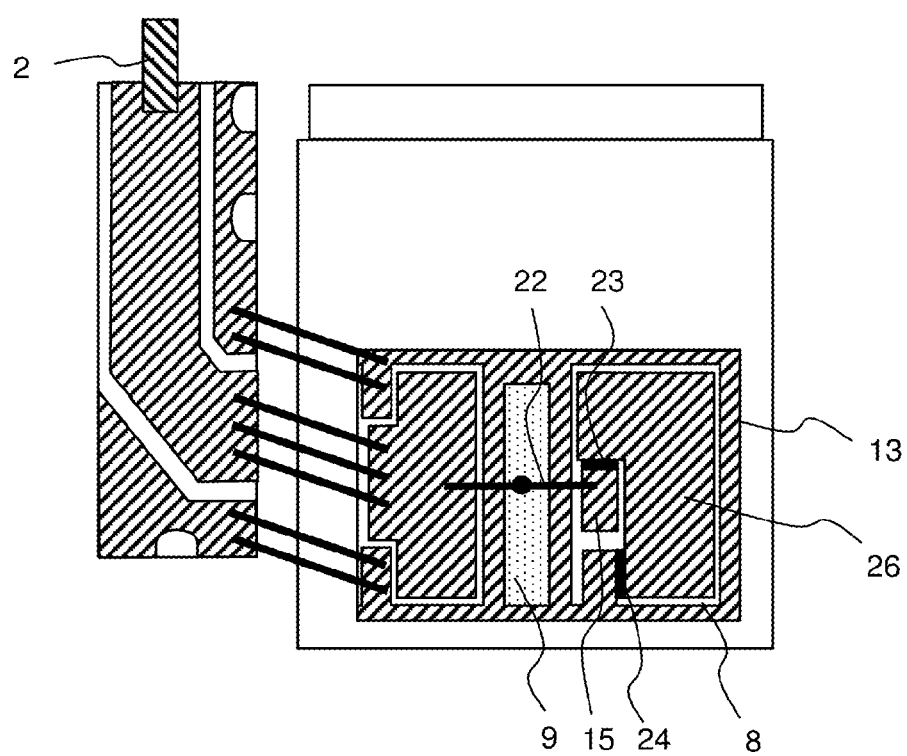
FIG. 9 is a plan view showing an essential part of an optical module, which is enlarged, according to Embodiment 2.

FIG. 9 is a plan view showing an essential part of an optical module according to Embodiment 2. A capacitor 25 shown in a circuit diagram in FIG. 3 is configured by a dielectric material of a dielectric substrate 8 on which a semiconductor optical modulation element 9 is mounted and a conductor 26. Capacitance will be expressed by following formula.

$$C=\varepsilon 0\times \varepsilon r\times A/d$$

Here, ε0 indicates a dielectric constant of vacuum, εr indicates a dielectric constant of the dielectric material, A indicates an area of the conductor, and d indicates a thickness of the dielectric material.

By sandwiching a dielectric material of the dielectric substrate 8 between the conductor 26 and a ground conductor 13, a same effect as that of a parallel plate capacitor can be obtained. Further, the conductor 26 and the ground conductor 13 function as a coplanar line, in addition to capacitance between a surface and a back surface, capacitance on a surface is added. By configuring the above mentioned, a capacitance component can be added cheaply.

Embodiment 3

Figure 10:
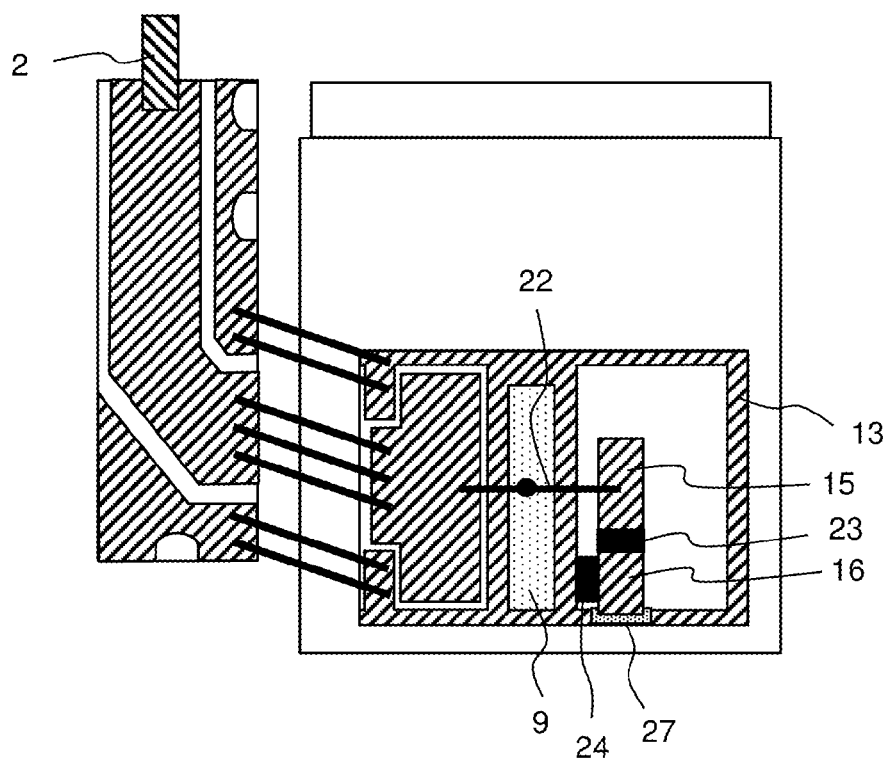
FIG. 10 is a plan view showing an essential part of an optical module, which is enlarged, according to Embodiment 3.

FIG. 10 is a plan view showing an essential part of an optical module according to Embodiment 3. A capacitor 25 shown with a circuit figure in FIG. 3 is configured by sandwiching a thin film dielectric 27 between a signal conductor 16 and a ground conductor 13 so as to make a MIM capacitor. For example, on a back surface of the signal conductor 16, or on a surface facing the signal conductor 16 of the ground conductor 13, by forming the thin film dielectric 27 with a $SiO_2$ having a thickness of 0.3 um, the capacitor 25 can be realized. A relative permittivity εr of $SiO_2$ is 4.0 to 4.5, therefore when the above mentioned formula of capacity is referred, it can be possible to make capacitance of 0.1 pF in an area of 30 um, therefore a configuration can be made in smaller space.

Embodiment 4

Figure 11:
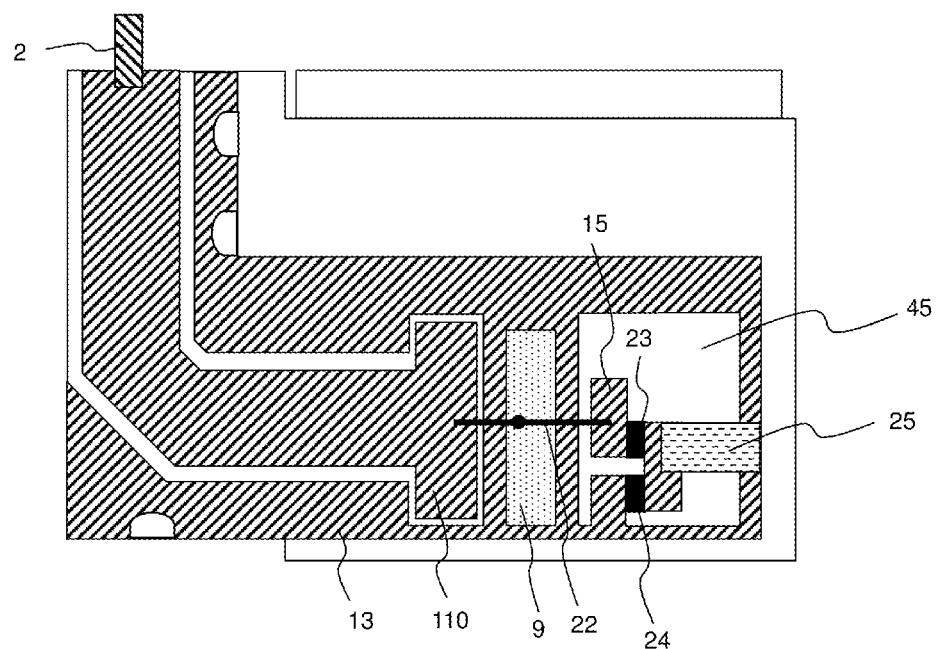
FIG. 11 is a plan view showing an essential part of an optical module, which is enlarged, according to Embodiment 4.

FIG. 11 is a plan view showing an essential part of an optical module according to Embodiment 4. A dielectric substrate is configured by a dielectric substrate 45 in which a dielectric substrate 6 and a dielectric substrate 8, which are described in Embodiment 1, are integrated. It is configured such that from a lead pin 2, via a signal conductor 110 which is formed on the dielectric substrate 45, using a bonding wire 22, a signal is supplied to a semiconductor optical modulation element 9. Therefore, in configurations in Embodiment 1 to Embodiment 3, bonding wires 19 to 21 which connect between the dielectric substrate 6 and the dielectric substrate 8 are necessary, however, in Embodiment 4, the bonding wires 19 to 21 can be omitted. In this configuration, from the lead pin 2 to the bonding wire 22, as a coplanar line which is configured by the signal conductor 110 and the ground conductor 13, characteristic impedance of the coplanar line is made to be 25Ω which is matched to characteristic impedance of a metal stem penetration section 30, for example.

Figure 12A:
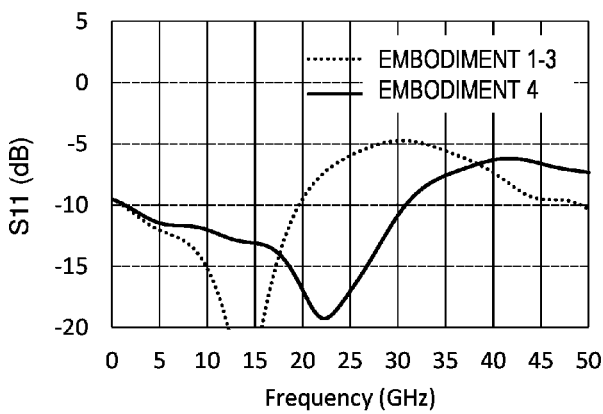
FIG. 12A and FIG. 12B are diagrams showing a frequency characteristics of an optical module according to Embodiment 4 by comparing with a frequency characteristics of an optical module according to Embodiments 1 to 3.
Figure 12B:
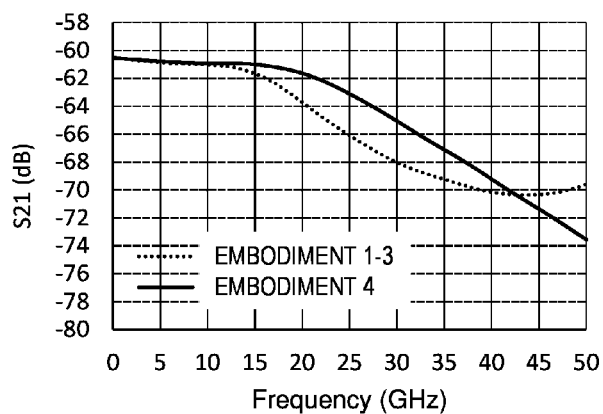

FIG. 12A and FIG. 12B show a high frequency response characteristic of an optical module having a configuration comprising bonding wires 19 to 21 shown in Embodiments 1 to 3, and that of an optical module having a configuration of Embodiment 4 in which bonding wires 19 to 21 are omitted and from a metal stem penetration section 30 to a bonding wire 22 of a semiconductor optical modulation element 9 is configured by one coplanar line. As an example, a result of simulation in which a first resistor 23 and a second resistor 24 are 25Ω, individually, and capacitance of a capacitor 25 is 0.1 pF. According to Embodiment 4 of this application, by omitting bonding wires 19 to 21, influence of wiring inductance will be eliminated, therefore, when Embodiment 4 is compared with Embodiments 1 to 3, it is found out such that further, cutoff frequency can be improved.

Embodiment 5

Figure 13:
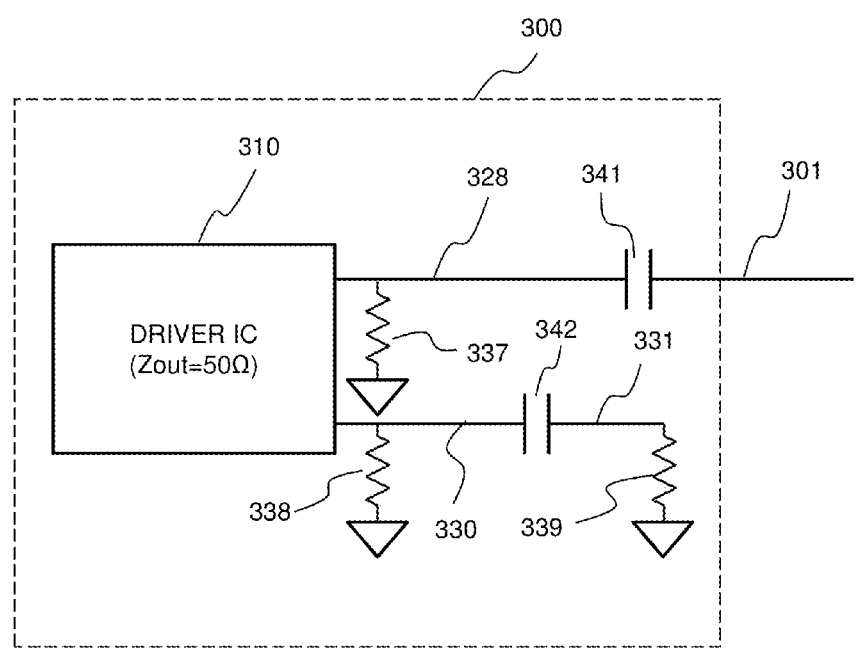
FIG. 13 is a circuit diagram showing an example of a driver which is provided outside of an optical module according to Embodiment 5.
Figure 14:
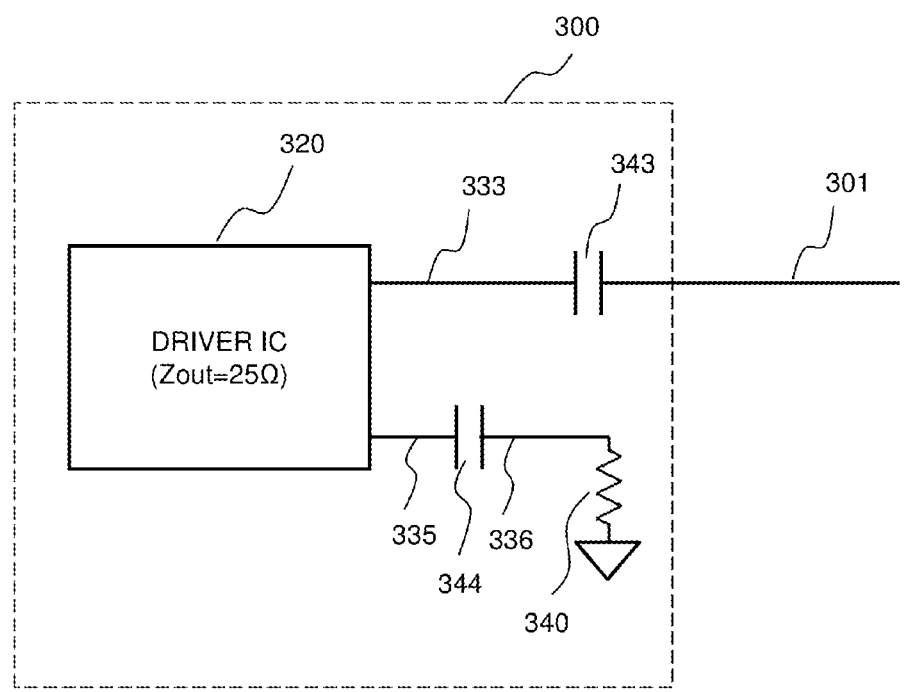
FIG. 14 is a circuit diagram showing another example of a driver which is provided outside of an optical module according to Embodiment 5.

FIG. 13 and FIG. 14 are circuit diagrams showing a driver which generates a high frequency signal for modulation which supplies to a semiconductor optical modulation element 9 of optical modules which are disclosed in Embodiments 1 to 4, that is an example of a driver 300 shown in FIG. 3 (in FIGs., a bias circuit for superimposing a DC voltage and a pull-up circuit are omitted). A configuration of the driver 300 shown in FIG. 13 shows an example in which a driver IC 310, which has output impedance 50Ω which is represented by a single-phase drive type which is used for modulation of an optical module which is mounted on the semiconductor optical modulation element 9, for example, is used. By connecting a resistor 337 having a resistance value 50Ω to one end of an output terminal of a driver IC 310 and connecting a resistor 338 having a resistance value 50Ω which is same as that of the resistor 337 to another end of an output terminal, output impedance of the driver IC 310 can be changed to be 25Ω, and in a case where characteristic impedance of a metal stem penetration section 30 is 25Ω, matching can be obtained. A signal line 301 having line impedance of 25Ω shown in FIG. 3 is connected to a capacitor 341 which is connected via a signal line 328 from an output terminal to which the resistor 337 is connected. Another output terminal of the driver IC 310 to which the resistor 338 is connected, a capacitor 342 is connected via a signal line 330, and another end of the capacitor 342, a resistor 339 having a resistance value 25Ω is connected via a signal line 331 having impedance 25Ω. According to the above mentioned configuration, DC gain will be deteriorated, however, cutoff frequency can be improved.

FIG. 14 shows an example in which a driver IC to be connected is used for modulation of Direct Modulated Laser (DML), that is, a differential drive type driver IC is used. In this case, output impedance of a driver IC 320 itself is 25Ω, therefore to a capacitor 343 which is connected to another end via a signal line 333, a signal line 301 having a resistance value 25Ω shown in FIG. 3 is connected. To another output end of the driver IC 320, a capacitance 344 is connected via a signal line 335, and another end of the capacitance 344 is connected to a resistor 340 having a resistance value 25Ω via a signal line 336 having line impedance 25Ω. Generally, by terminating a signal line 336 which is connected to a differential line of a DML optical module with 25Ω, deterioration of DC gain can be suppressed and cutoff frequency can be improved. Further, a driver IC which is used for DML can be applied, therefore, it can be produced cheaply.

Figure 15:
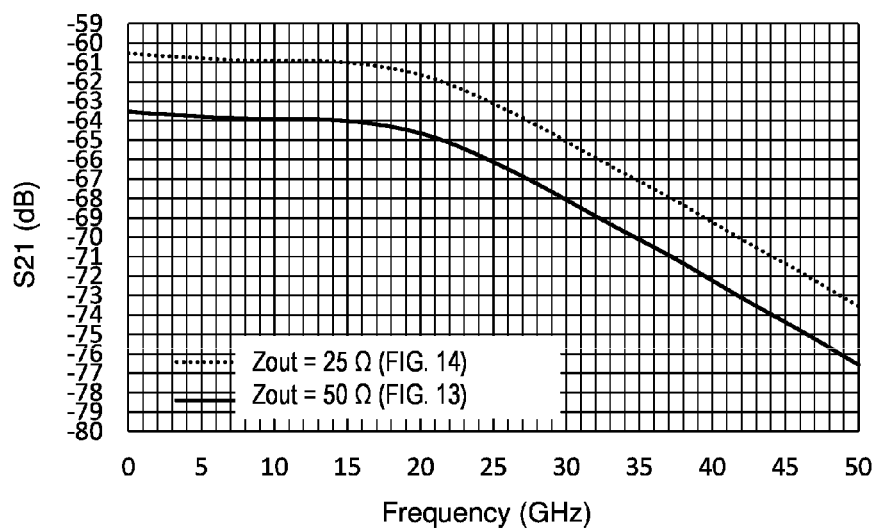
FIG. 15 is a frequency characteristic diagram for describing an effect of a driver which is provided outside of an optical module according to Embodiment 5.

FIG. 15 shows a simulation result of a high frequency response characteristic in a case where a driver 300 shown in FIG. 13 and FIG. 14 is used. When a driver 300 in which a driver IC 320 having output impedance 25Ω shown in FIG. 14 is used, deterioration of DC gain can be suppressed more, however, it is shown such that cutoff characteristic is excellent when either driver is used. In the above mentioned, a case in which characteristic impedance of the metal stem penetration section 30 is 25Ω, output impedance of the driver 300 is 25Ω is described, however, it is not necessary for output impedance of the driver 300 to be matched correctly to characteristic impedance of the metal stem penetration section 30, in a range where the above mentioned effect can be obtained, it is good to be substantially equal to characteristic impedance of the metal stem penetration section 30, and for example, it is preferable to be a value in a range which is 0.8 to 1.2 times of characteristic impedance of the metal stem penetration section 30.

In this application, various examples of Embodiment and Example are described, however, various feature, embodiment and function which are described in one or plural embodiments are not only limited to specific embodiment, and in a singular or various combinations, they can be applied to Embodiment. Consequently, numerous example which are not shown are supposed in a range of technology which is disclosed in this specification. For example, a case where at least one constitution element is deformed, a case in which a constitution element is added or omitted, further, and a case in which at least one constitution element is extracted and the constitution element is combined with another constitution element in other embodiment are contained.

DESCRIPTION OF REFERENCE SIGNS 1. metal stem
2. lead pin
3. dielectric member
8, 45 dielectric substrate
9. semiconductor optical modulation element
13. ground conductor
23. first resistor
24. second resistor
25. capacitor

26. conductor
30. metal stem penetration section
200. terminal matching circuit
300. driver
500. optical module
600. optical transmitter

The invention claimed is:

1. An optical module comprising a metal stem having a plate-like shape that has a first side, a second side, and a curvilinear surface extending therebetween, and a semiconductor optical modulation element mounted on a dielectric substrate provided on the first side of the metal stem,
wherein the metal stem has a metal stem penetration section in which a lead pin made of metal is inserted coaxially in a penetration hole which is formed in the metal stem and a dielectric member is provided to fill the penetration hole around an outer circumference of the lead pin, and
from the second side of the metal stem, via the metal stem penetration section, a signal for modulation is supplied to the semiconductor optical modulation element connected in parallel with a terminal matching circuit,
wherein the terminal matching circuit is configured by a series connecting body which is comprised of a first resistor and a parallel body which is comprised of a second resistor and a capacitor.

2. The optical module according to claim 1,
wherein the first resistor has a value of resistance which is substantially equal to a characteristic impedance of the metal stem penetration section.

3. The optical module according to claim 2,
wherein the second resistor has a value of resistance which is substantially equal to the characteristic impedance of the metal stem penetration section.

4. The optical module according to claim 1,
wherein via a signal line which is formed on the dielectric substrate, the signal is supplied to the semiconductor optical modulation element.

5. The optical module according to claim 4,
wherein a characteristic impedance of the signal line is substantially equal to a characteristic impedance of the metal stem penetration section.

6. The optical module according to claim 1, wherein a characteristic impedance of the metal stem penetration section is 25Ω.

7. The optical module according to claim 1, wherein the capacitor is constituted by a conductor which is formed on the dielectric substrate and a ground conductor and a dielectric member which constitutes the dielectric substrate.

8. The optical module according to claim 1, wherein the metal stem penetration section has an air-tight sealing structure.

9. An optical transmitter comprising an optical module according to claim 1 and a driver which outputs the signal for modulation to be supplied to the semiconductor optical modulation element,
wherein an output impedance of the driver is substantially equal to a characteristic impedance of the metal stem penetration section.

* * * * *